(12) United States Patent
Yoshimochi

(10) Patent No.: US 10,868,164 B2
(45) Date of Patent: Dec. 15, 2020

(54) NITRIDE SEMICONDUCTOR DEVICE

(71) Applicant: ROHM CO., LTD., Kyoto (JP)

(72) Inventor: Kenichi Yoshimochi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/353,104

(22) Filed: Mar. 14, 2019

(65) Prior Publication Data
US 2019/0296140 A1 Sep. 26, 2019

(30) Foreign Application Priority Data

Mar. 22, 2018 (JP) ................. 2018-054895

(51) Int. Cl.
| | | |
|---|---|---|
| *H01L 29/66* | (2006.01) | |
| *H01L 29/778* | (2006.01) | |
| *H01L 29/20* | (2006.01) | |
| *H01L 29/205* | (2006.01) | |
| *H01L 21/02* | (2006.01) | |
| *H01L 29/423* | (2006.01) | |
| *H01L 29/417* | (2006.01) | |

(52) U.S. Cl.
CPC ...... *H01L 29/7787* (2013.01); *H01L 21/0254* (2013.01); *H01L 21/0262* (2013.01); *H01L 29/2003* (2013.01); *H01L 29/205* (2013.01); *H01L 29/41775* (2013.01); *H01L 29/42356* (2013.01); *H01L 29/66462* (2013.01)

(58) Field of Classification Search
CPC ............ H01L 21/0254; H01L 21/0262; H01L 29/2003; H01L 29/205; H01L 29/7787
USPC ...................................................... 257/194
See application file for complete search history.

(56) References Cited

U.S. PATENT DOCUMENTS

| | | | | | |
|---|---|---|---|---|---|
| 7,812,372 | B2 * | 10/2010 | Okita | .................. | H01L 29/7371 257/187 |
| 8,575,657 | B2 * | 11/2013 | Gambin | .............. | H01L 23/3732 257/194 |
| 9,166,133 | B2 * | 10/2015 | Tsuda | .................... | H01L 33/642 |
| 2006/0273347 | A1 | 12/2006 | Hikita et al. | | |
| 2013/0193485 | A1 * | 8/2013 | Akiyama | .............. | H01L 29/778 257/194 |

FOREIGN PATENT DOCUMENTS

| | | |
|---|---|---|
| JP | 2006-339561 | 12/2006 |
| JP | 2012-109366 | 6/2012 |
| JP | 2013-065612 | 11/2013 |

* cited by examiner

*Primary Examiner* — Tan N Tran
(74) *Attorney, Agent, or Firm* — Gregory M. Howison

(57) ABSTRACT

A nitride semiconductor device includes: a Si substrate having a surface and a rear surface; a first nitride semiconductor layer arranged on the surface of the Si substrate and constituting an electron transit layer; a second nitride semiconductor layer formed on the first nitride semiconductor layer and constituting an electron supply layer; a gate electrode arranged on the second nitride semiconductor layer; a source electrode and a drain electrode arranged on the second nitride semiconductor layer so as to be separated from the gate electrode with the gate electrode interposed therebetween, and electrically connected to the second nitride semiconductor layer; at least one recess formed on the Si substrate and recessed from the rear surface toward the surface of the Si substrate; and a thermal conductor embedded in the at least one recess and made of material having a thermal conductivity higher than a thermal conductivity of the Si substrate.

15 Claims, 15 Drawing Sheets

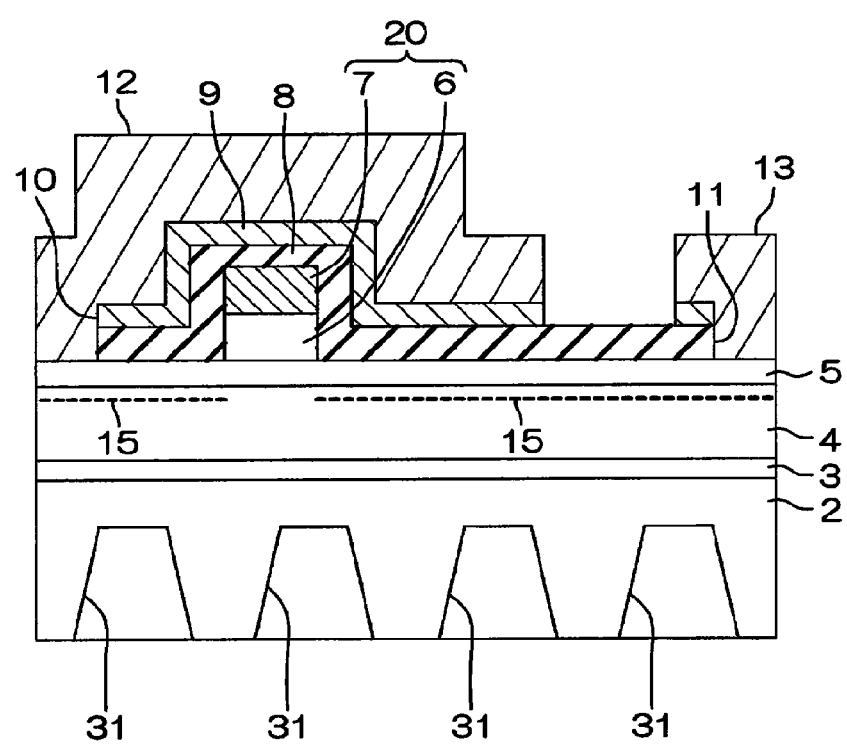

NITRIDE SEMICONDUCTOR DEVICE

CROSS-REFERENCE TO RELATED APPLICATIONS

This application claims priority to and/or benefit from Japanese Patent Application No. 2018-054895 filed on Mar. 22, 2018, the entire contents of which are incorporated herein by reference.

TECHNICAL FIELD

The present disclosure relates to a nitride semiconductor device formed of a group III nitride semiconductor (hereinafter, simply may be referred to as a "nitride semiconductor").

BACKGROUND

A group III nitride semiconductor is a semiconductor using nitrogen as a group V element in group III-V semiconductors. Typical examples are aluminum nitride (AlN), gallium nitride (GaN), and indium nitride (InN). Generally, it may be expressed as $Al_xIn_yGa_{1-x-y}N$ (where $0 \leq x \leq 1$, $0 \leq y \leq 1$, and $0 \leq x+y \leq 1$).

In a related art, a high electron mobility transistor (HEMT) using a nitride semiconductor is disclosed. The HEMT of the related art includes a Si substrate, an electron transit layer made of GaN and formed on the Si substrate, and an electron supply layer made of AlGaN formed on the electron transit layer. A pair of source and drain electrodes are formed so as to make contact with the electron supply layer, and a gate electrode is arranged between them. For polarization due to a lattice mismatch between GaN and AlGaN, a two-dimensional (2D) electron gas is formed in the electron transit layer at a position several Å inward from the interface between the electron transit layer and the electron supply layer. With this 2D electron gas as a channel, the source and the drain are connected. When the 2D electron gas is blocked by applying a control voltage to the gate electrode, the source and the drain are cut off. Since electricity is conducted between the source and the drain in a state where the control voltage is not applied to the gate electrode, it becomes a normally-ON type device.

A normally-OFF type HEMT has already been developed as the nitride semiconductor HEMT. The structure for realizing the normally-OFF type nitride semiconductor HEMT is proposed in the related art.

In the related art, there is a configuration that achieves normally-OFF by laminating a p-type GaN layer on an AlGaN electron supply layer, arranging a gate electrode thereon, and eliminating a channel by a depletion layer spreading from the p-type GaN layer.

In the related art, an oxide film having an interface continuing to the interface between the electron supply layer and the electron transit layer is formed on the electron transit layer. Further, the gate electrode faces the electron transit layer with the oxide film interposed therebetween. In this configuration, since the electron supply layer does not exist right under the gate electrode, the 2D electron gas is not formed right under the gate electrode, thus achieving the normally-OFF. The oxide film is formed by, for example, thermally oxidizing a part of the electron supply layer.

In the nitride semiconductor device mentioned above, it may be considered to dissipate heat generated in the device from a rear surface of the substrate. In the nitride semiconductor device using the Si substrate as the substrate, however, since it is necessary to transfer the heat generated in the device to the rear side of the substrate via the Si substrate having a relatively low thermal conductivity, there is a problem that heat dissipation efficiency is low.

SUMMARY OF THE INVENTION

The present disclosure provides some embodiments of a nitride semiconductor device having a Si substrate that is capable of efficiently dissipating heat generated in the device from a rear surface of the Si substrate According to one embodiment of the present disclosure, a nitride semiconductor device includes: a Si substrate having a surface and a rear surface; a first nitride semiconductor layer arranged on the surface of the Si substrate and constituting an electron transit layer; a second nitride semiconductor layer formed on the first nitride semiconductor layer and constituting an electron supply layer; a gate electrode arranged on the second nitride semiconductor layer; a source electrode and a drain electrode arranged on the second nitride semiconductor layer so as to be separated from the gate electrode with the gate electrode interposed therebetween, and electrically connected to the second nitride semiconductor layer; at least one recess formed on the Si substrate and recessed from the rear surface toward the surface of the Si substrate; and a thermal conductor embedded in the at least one recess and made of a material having a thermal conductivity higher than a thermal conductivity of the Si substrate.

With this configuration, since heat generated in the device can be transferred to the rear side of the Si substrate via the thermal conductor made of a material having a thermal conductivity higher than that of the Si substrate, it is possible to efficiently dissipate the heat generated in the device from the rear surface of the substrate.

According to an embodiment of the present disclosure, the device further includes a thermal conductive film formed on the rear surface of the Si substrate so as to make contact with the thermal conductor and made of a material having a thermal conductivity higher than that of the Si substrate.

With this configuration, since heat generated in the device can be efficiently transferred to the thermal conductive film formed on the rear surface side of the Si substrate, it is possible to more efficiently dissipate the heat generated in the device from the rear surface of the Si substrate.

According to an embodiment of the present disclosure, the at least one recess includes a plurality of recesses, and the plurality of recesses are arranged in a staggered arrangement in a bottom view as viewed from a normal direction with respect to the rear surface of the Si substrate.

According to an embodiment of the present disclosure, the at least one recess includes a plurality of recesses, and the plurality of recesses are arranged in a matrix form in a bottom view as viewed from a normal direction with respect to the rear surface of the Si substrate.

According to an embodiment of the present disclosure, cross sections of the plurality of recesses are circular or polygonal.

According to an embodiment of the present disclosure, the at least one recess includes a plurality of elongated rectangular recesses extending parallel to each other in a predetermined direction along the rear surface of the Si substrate in a bottom view as viewed from a normal direction with respect to the rear surface of the Si substrate.

According to an embodiment of the present disclosure, the at least one recess includes a plurality of elongated rectangular first recesses extending parallel to each other in a predetermined first direction along the rear surface of the Si substrate, and a plurality of elongated rectangular second recesses extending parallel to each other in a second direction that is along the rear surface of the Si substrate and orthogonal to the predetermined first direction, in a bottom view as viewed from a normal direction with respect to the rear surface of the Si substrate, the plurality of elongated rectangular second recesses intersecting the plurality of elongated rectangular first recesses.

According to an embodiment of the present disclosure, the thermal conductor is made of Cu.

According to an embodiment of the present disclosure, the thermal conductive film is made of any one selected among Ti, Ni, Cu, Ag, Au, Pb, Sn, Sb, Bi, In, and Al, or any combination thereof.

According to an embodiment of the present disclosure, the device further includes a third nitride semiconductor layer arranged between the Si substrate and the first nitride semiconductor layer and constituting a buffer layer.

According to an embodiment of the present disclosure, the first nitride semiconductor layer is made of a GaN layer and the second nitride semiconductor layer is made of an AlGaN layer.

According to an embodiment of the present disclosure, the first nitride semiconductor layer is made of a GaN layer, the second nitride semiconductor layer is made of an AlGaN layer, and the buffer layer is made of a laminated film of an AlN layer formed on the surface of the Si substrate and an AlGaN layer formed on the AlN layer.

BRIEF DESCRIPTION OF THE DRAWINGS

FIG. 4H is a cross-sectional view illustrating a next step of FIG. 4G.

DETAILED DESCRIPTION OF THE PREFERRED EMBODIMENTS

Embodiments of the present disclosure will be now described in detail with reference to the drawings.

Figure 1:
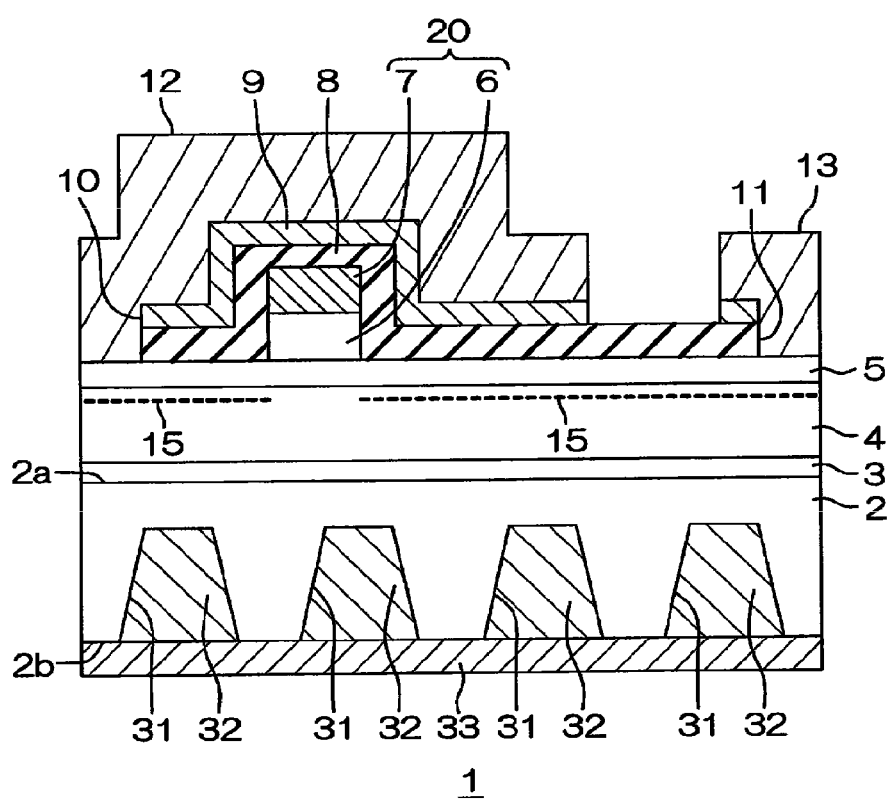
FIG. 1 is a schematic cross-sectional view illustrating a configuration of a nitride semiconductor device according to a first embodiment of the present disclosure.

FIG. 1 is a schematic cross-sectional view illustrating a configuration of a nitride semiconductor device according to a first embodiment of the present disclosure.

A nitride semiconductor device 1 includes a substrate 2, a buffer layer 3 formed on a surface 2a of the substrate 2, a first nitride semiconductor layer 4 epitaxially grown on the buffer layer 3, and a second nitride semiconductor layer 5 epitaxially grown on the first nitride semiconductor layer 4. Further, the nitride semiconductor device 1 includes a gate part 20 formed on the second nitride semiconductor layer 5.

In addition, the nitride semiconductor device 1 includes a passivation film 8 that covers the second nitride semiconductor layer 5 and the gate part 20, and a barrier metal film 9 laminated on the passivation film 8. Further, the nitride semiconductor device 1 includes a source electrode 12 and a drain electrode 13 which are in ohmic contact with the second nitride semiconductor layer 5 through a source electrode contact hole 10 and a drain electrode contact hole 11 formed on a laminated film of the passivation film 8 and the barrier metal film 9. The source electrode 12 and the drain electrode 13 are arranged at an interval. The source electrode 12 is formed so as to cover the gate part 20.

The substrate 2 is made of a silicon (Si) substrate. In the present embodiment, the substrate 2 is configured as a low-resistance silicon substrate. The low-resistance silicon substrate may have an impurity concentration of, for example, $1 \times 10^{17}$ cm$^{-3}$ to $1 \times 10^{20}$ cm$^{-3}$ (more specifically, about $1 \times 10^{18}$ cm$^{-3}$). The thickness of the substrate 2 is about 50 μm to 1,000 μm.

The buffer layer 3 is a buffer layer for alleviating distortion caused by a difference between a lattice constant of the first nitride semiconductor layer 4 formed on the buffer layer 3 and a lattice constant of the substrate 2. In the present embodiment, the buffer layer 3 is configured as a multilayer buffer layer in which a plurality of nitride semiconductor films are laminated. In the present embodiment, the buffer layer 3 is configured as a laminated film of an AlN film making contact with the surface 2a of the substrate 2 and an AlGaN film laminated on a surface (a surface on the opposite side of the substrate 2) of the AlN film. The thickness of the AlN film is about 0.2 µm. The thickness of the AlGaN film is about 0.12 µm. The buffer layer 3 may be configured as a single film of the AlN film or a single film of the AlGaN film.

The first nitride semiconductor layer 4 constitutes an electron transit layer. In the present embodiment, the first nitride semiconductor layer 4 is configured as a GaN layer doped with an acceptor type impurity, and has a thickness of about 1 µm. The concentration of the acceptor type impurity is preferably $4 \times 10^{16}$ cm$^{-3}$ or more. In the present embodiment, the acceptor type impurity is carbon (C).

The second nitride semiconductor layer 5 constitutes an electron supply layer. The second nitride semiconductor layer 5 is formed of a nitride semiconductor having a band gap larger than that of the first nitride semiconductor layer 4. Specifically, the second nitride semiconductor layer 5 is formed of a nitride semiconductor having an Al composition higher than that of the first nitride semiconductor layer 4. In the nitride semiconductors, the higher the Al composition is, the larger the band gap is. In the present embodiment, the second nitride semiconductor layer 5 is configured as an $Al_{x1}Ga_{1-x1}N$ layer (where 0<x1<1), and has a thickness of about 10 to 30 nm.

In this manner, the first nitride semiconductor layer 4 (electron transit layer) and the second nitride semiconductor layer 5 (electron supply layer) are formed of nitride semiconductors having different band gaps (Al compositions), and a lattice mismatch occurs between them. Further, due to spontaneous polarization of the first nitride semiconductor layer 4 and the second nitride semiconductor layer 5 and piezo polarization caused by the lattice mismatch therebetween, the energy level of the conduction band of the first nitride semiconductor layer 4 becomes lower than the Fermi level at the interface between the first nitride semiconductor layer 4 and the second nitride semiconductor layer 5. Thus, a 2D electron gas (2 DEG) 15 spreads at a position (for example, at a distance of several A from the interface) close to the interface between the first nitride semiconductor layer 4 and the second nitride semiconductor layer 5.

The gate part 20 includes a nitride semiconductor gate layer 6 epitaxially grown on the second nitride semiconductor layer 5 and a gate electrode 7 formed on the nitride semiconductor gate layer 6. The gate part 20 is arranged so as to be biased toward the source electrode contact hole 10. An element structure is formed by sandwiching the gate electrode 7 between the source electrode 12 and the drain electrode 13. The nitride semiconductor device 1 is actually formed so as to be longer than the one illustrated in FIG. 1 in a lateral direction of the page of FIG. 1, and the source electrode (S) 12, the gate electrode (G) 7, and the drain electrode (D) 13 are periodically arranged in the order of SGDGSGD in the lateral direction of the page of FIG. 1.

The nitride semiconductor gate layer 6 is formed of a nitride semiconductor doped with an acceptor type impurity. In the present embodiment, the nitride semiconductor gate layer 6 is configured as a GaN layer (p-type GaN layer) doped with an acceptor type impurity, and has a thickness of about 10 to 100 nm. The concentration of the acceptor type impurity implanted into the nitride semiconductor gate layer 6 may be $3 \times 10^{17}$ cm$^{-3}$ or more in some embodiments. In the present embodiment, the acceptor type impurity is magnesium (Mg). The acceptor type impurity may be an acceptor type impurity other than Mg, such as carbon (C) or the like. The nitride semiconductor gate layer 6 is installed in a region right under the gate part 20 in order to offset the 2D electron gas 15 generated at the interface between the first nitride semiconductor layer 4 (electron transit layer) and the second nitride semiconductor layer 5 (electron supply layer).

The gate electrode 7 is formed so as to make contact with the surface of the nitride semiconductor gate layer 6. In the present embodiment, the gate electrode 7 is configured as a TiN layer, and has a thickness of about 100 nm.

The passivation film 8 is configured to cover the surface of the second nitride semiconductor layer 5 (except regions where the contact holes 10 and 11 face), the side surface of the nitride semiconductor gate layer 6, and the side surface and the surface of the gate electrode 7. In the present embodiment, the passivation film 8 is configured as a SiN film and has a thickness of about 100 nm.

The barrier metal film 9 is laminated on the passivation film 8 so as to cover the gate part 20. In the present embodiment, the barrier metal film 9 is configured as a TiN film and has a thickness of about 50 nm.

The source electrode 12 and the drain electrode 13 may have, for example, a lower layer making contact with the second nitride semiconductor layer 5, an intermediate layer laminated on the lower layer, and an upper layer laminated on the intermediate layer. The lower layer may be Ti having a thickness of about 20 nm, the intermediate layer may be Al having a thickness of about 200 nm, and the upper layer may be TiN having a thickness of about 50 nm.

A plurality of recesses 31 recessed from the rear surface 2b toward the surface 2a side are formed on the substrate 2. A thermal conductor 32 made of a material having a thermal conductivity higher than that of the Si substrate 2 is embedded in each recess 31. In the present embodiment, the thermal conductor 32 is formed so as to fill the space in the recess 31. The thermal conductor 32 is made of, for example, copper (Cu). In addition to being made of Cu, the thermal conductor 32 may be made of one arbitrarily selected from Ti, Ni, Cu, Ag, Au, Pb, Sn, Sb, Bi, In, and Al, or any combination thereof.

Figure 2:
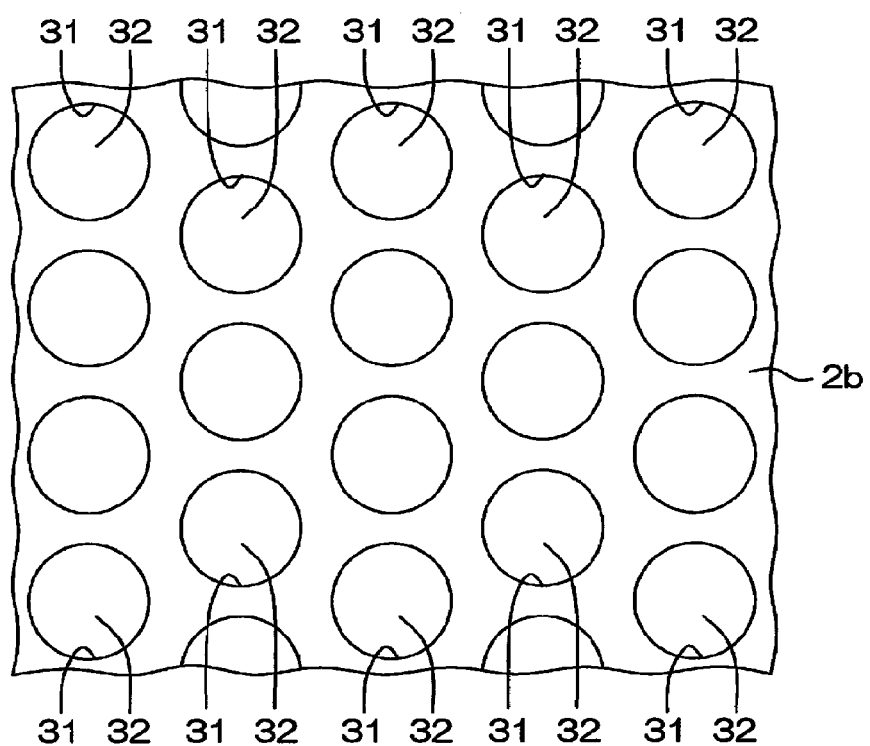
FIG. 2 is a schematic bottom view illustrating an example of an arrangement pattern of recesses, in which a thermal conductive film formed on a rear surface of a substrate is omitted.
Figure 3:
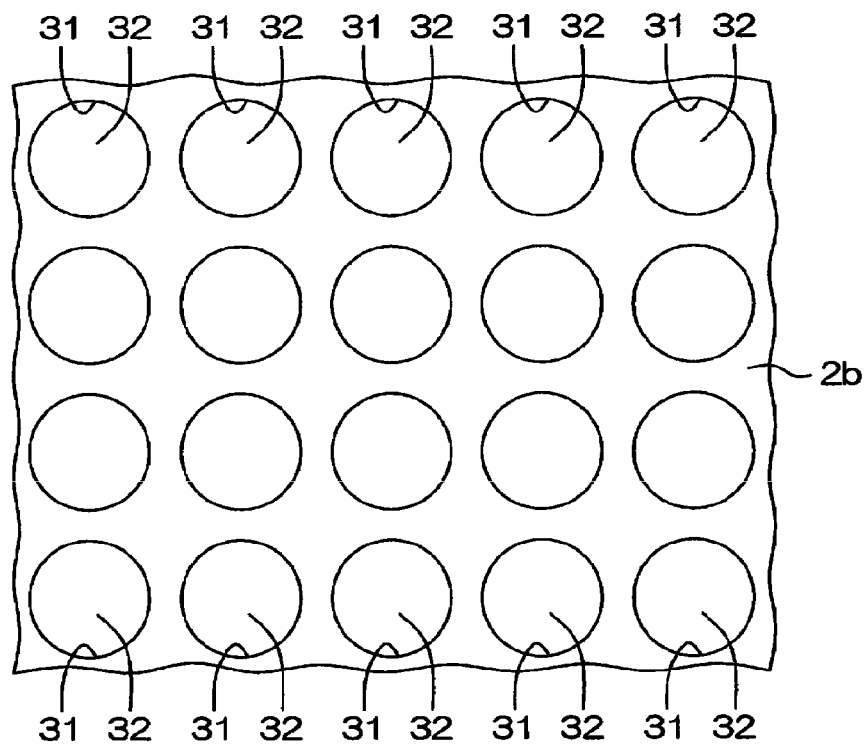
FIG. 3 is a schematic bottom view illustrating another example of an arrangement pattern of recesses, in which the thermal conductive film formed on the rear surface of the substrate is omitted.

In the present embodiment, the recess 31 (thermal conductor 32) has a truncated cone shape whose cross section is gradually reduced from the rear surface 2b toward the surface 2a of the substrate 2. In other words, the cross section of the recess 31 (thermal conductor 32) is circular. As illustrated in FIG. 2, the plurality of recesses 31 (thermal conductors 32) are arranged in a staggered arrangement in a bottom view as viewed from the normal direction with respect to the rear surface 2b of the substrate 2 (in a plan view as viewed from the normal direction with respect to the surface 2a of the substrate 2). As illustrated in FIG. 3, the plurality of recesses 31 (thermal conductors 32) may be arranged in a matrix form. In FIGS. 2 and 3, for convenience of description, a thermal conductive film 33 (see FIG. 1) on the rear surface 2b side of the substrate 2 as described below is omitted. The recess 31 may be columnar.

The thermal conductive film 33 is formed on the rear surface 2b of the substrate 2 so as to make contact with the thermal conductors 32. The thermal conductive film 33 is made of a material having a thermal conductivity higher than that of the Si substrate 2. The thermal conductive film 33 is configured with, for example, a laminated film of Ti, Ni, and Ag. In addition to being configured with the laminated film of Ti, Ni, and Ag, the thermal conductive film 33 may be made of any one selected among Ti, Ni, Cu, Ag, Au, Pb, Sn, Sb, Bi, In, and Al, or any combination thereof.

In this semiconductor device 1, the second nitride semiconductor layer 5 (electron supply layer) having a different band gap (Al composition) is formed on the first nitride semiconductor layer 4 (electron transit layer) to form a heterojunction. Thus, the 2D electron gas 15 is formed in the first nitride semiconductor layer 4 near the interface between the first nitride semiconductor layer 4 and the second nitride semiconductor layer 5 to form an HEMT using the 2D electron gas 15 as a channel.

The gate electrode 7 faces the second nitride semiconductor layer 5 with the nitride semiconductor gate layer 6 made of a p-type GaN layer interposed therebetween. The energy levels of the first nitride semiconductor layer 4 and the second nitride semiconductor layer 5 are raised under the gate electrode 7 by an ionized acceptor contained in the nitride semiconductor gate layer 6 configured as the p-type GaN layer. Therefore, the energy level of the conduction band at the heterojunction interface between the first nitride semiconductor layer 4 and the second nitride semiconductor layer 5 becomes larger than the Fermi level. Thus, the 2D electron gas 15 caused by the spontaneous polarization of the first nitride semiconductor layer 4 and the second nitride semiconductor layer 5 and the piezo polarization due to their lattice mismatch is not formed right under the gate electrode 7 (gate part 20).

Therefore, when no bias is applied to the gate electrode 7 (at zero bias), the channel by the 2D electron gas 15 is blocked right under the gate electrode 7. Thus, a normally-OFF type HEMT is realized. When an appropriate ON voltage (e.g., 3 V) is applied to the gate electrode 7, the channel is induced in the first nitride semiconductor layer 4 right under the gate electrode 7, and the 2D electron gas 15 on both sides of the gate electrode 7 is connected. This allows conduction of electricity between the source and the drain.

When in use, for example, a predetermined voltage (e.g., 200 to 300 V) at which the drain electrode 13 becomes positive is applied between the source electrode 12 and the drain electrode 13. In this state, an OFF voltage (0 V) or an ON voltage (3 V) is applied to the gate electrode 7 with the source electrode 12 at a reference potential (0 V).

FIGS. 4A to 4G are cross-sectional views illustrating an example of a manufacturing process of the nitride semiconductor device 1 described above, in which cross-sectional structures in a plurality of steps of the manufacturing process are shown.

Figure 4A:
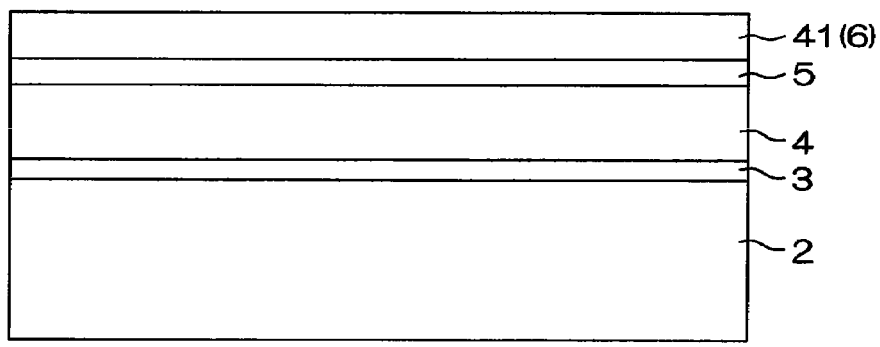
FIG. 4A is a cross-sectional view illustrating an example of a manufacturing process of the nitride semiconductor device.

First, as illustrated in FIG. 4A, a buffer layer 3 and a first nitride semiconductor layer (electron transit layer) 4 are epitaxially grown sequentially on a substrate 2 by a metal organic chemical vapor deposition (MOCVD) method. Further, a second nitride semiconductor layer (electron supply layer) 5 is epitaxially grown on the first nitride semiconductor layer 4 by the MOCVD method. In addition, a gate layer material film 41, which is a material film of a nitride semiconductor gate layer 6, is epitaxially grown on the second nitride semiconductor layer 5.

Figure 4B:
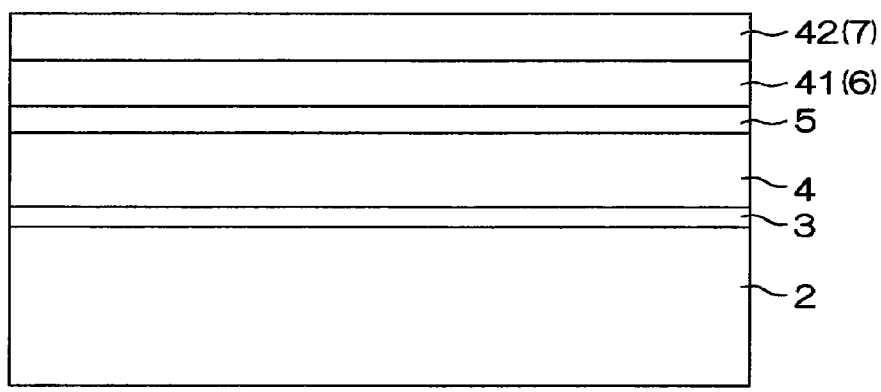
FIG. 4B is a cross-sectional view illustrating a next step of FIG. 4A.

Next, as illustrated in FIG. 4B, a gate electrode film 42, which is a material film of a gate electrode 7, is formed on the gate layer material film 41 by a sputtering method or a vapor deposition method. The gate electrode film 42 is configured as, for example, a metal film of TiN.

Figure 4C:
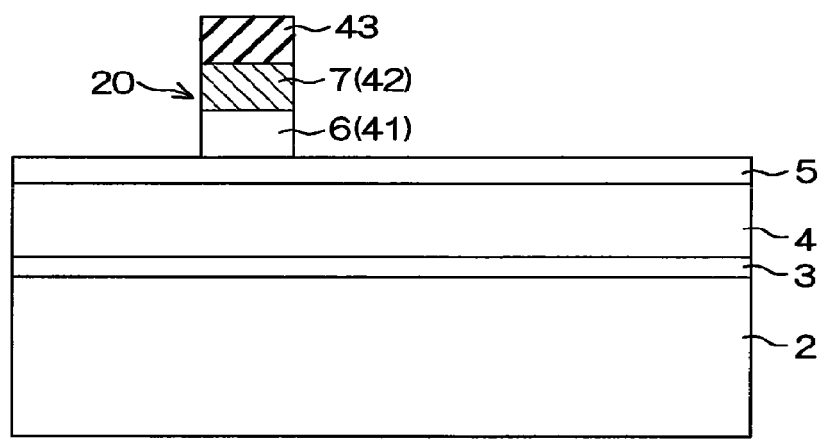
FIG. 4C is a cross-sectional view illustrating a next step of FIG. 4B.

Next, as illustrated in FIG. 4C, a resist film 43 is formed to cover a region where a gate electrode is to be formed on the surface of the gate electrode film 42. Then, the gate electrode film 42 and the gate layer material film 41 are selectively etched using the resist film 43 as a mask.

Thus, the gate electrode film 42 is patterned to obtain the gate electrode 7. Further, the gate layer material film 41 is patterned in the same pattern as the gate electrode 7. In this manner, a gate part 20 constituted by the nitride semiconductor gate layer 6 and the gate electrode 7 is formed on the second nitride semiconductor layer 5.

Figure 4D:
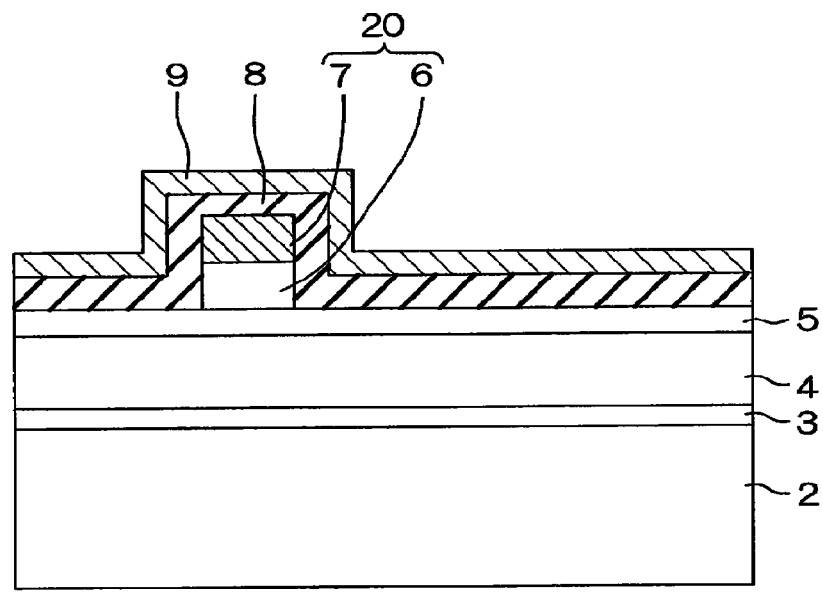
FIG. 4D is a cross-sectional view illustrating a next step of FIG. 4C.

Next, the resist film 43 is removed. Thereafter, as illustrated in FIG. 4D, a passivation film 8 is formed by a plasma CVD or LPCVD method so as to cover the entire exposed surface. Then, a barrier metal film 9 is formed on the surface of the passivation film 8 by the sputtering method. The passivation film 8 is configured as, for example, a SiN layer. The barrier metal film 9 is configured as, for example, a TiN layer.

Figure 4E:
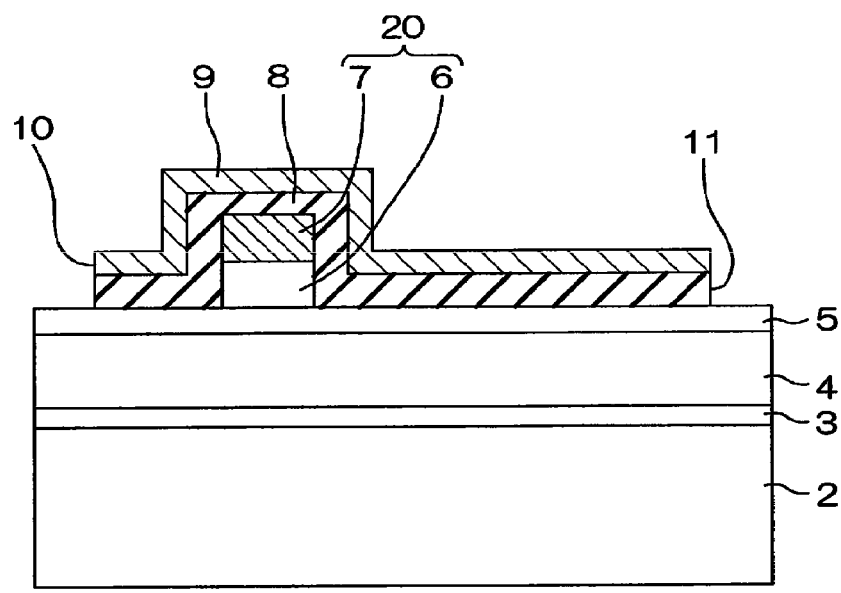
FIG. 4E is a cross-sectional view illustrating a next step of FIG. 4D.

Next, as illustrated in FIG. 4E, a source electrode contact hole 10 and a drain electrode contact hole 11 are formed on a laminated film of the passivation film 8 and the barrier metal film 9.

Figure 4F:
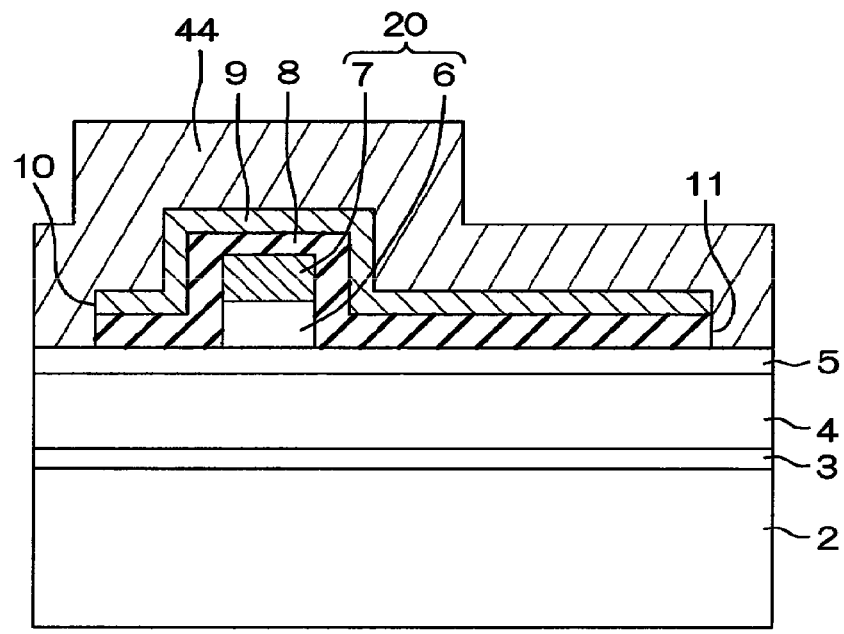
FIG. 4F is a cross-sectional view illustrating a next step of FIG. 4E.

Next, as illustrated in FIG. 4F, a source-drain electrode film 44 is formed so as to cover the entire exposed surface. The source-drain electrode film 44 is configured as a laminated metal film formed by laminating a Ti layer as a lower layer, an Al layer as an intermediate layer, and a TiN layer as an upper layer, and is formed by sequentially depositing the respective layers.

Figure 4G:
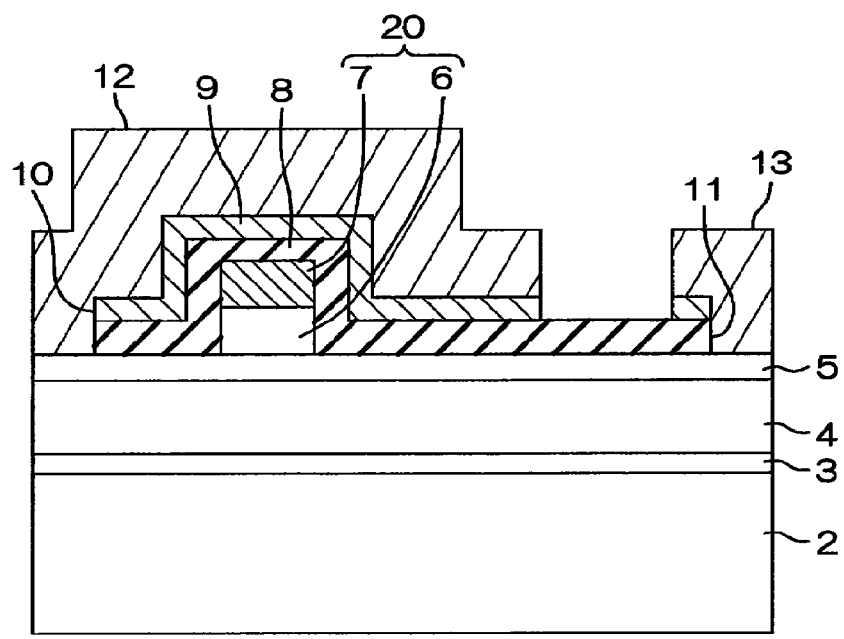
FIG. 4G is a cross-sectional view illustrating a next step of FIG. 4F.

Next, as illustrated in FIG. 4G, the source-drain electrode film 44 and the barrier metal film 9 are patterned by etching and further annealed to form a source electrode 12 and a drain electrode 13, which make ohmic contact with the second nitride semiconductor layer 5.

Next, a resist film is formed to cover a region where a recess is to be formed on the rear surface 2b of the substrate 2. Then, the substrate 2 is selectively etched using the resist film as a mask. Thus, as illustrated in FIG. 4H, a plurality of recesses 31 are formed on the rear surface 2b of the substrate 2.

Figure 4I:
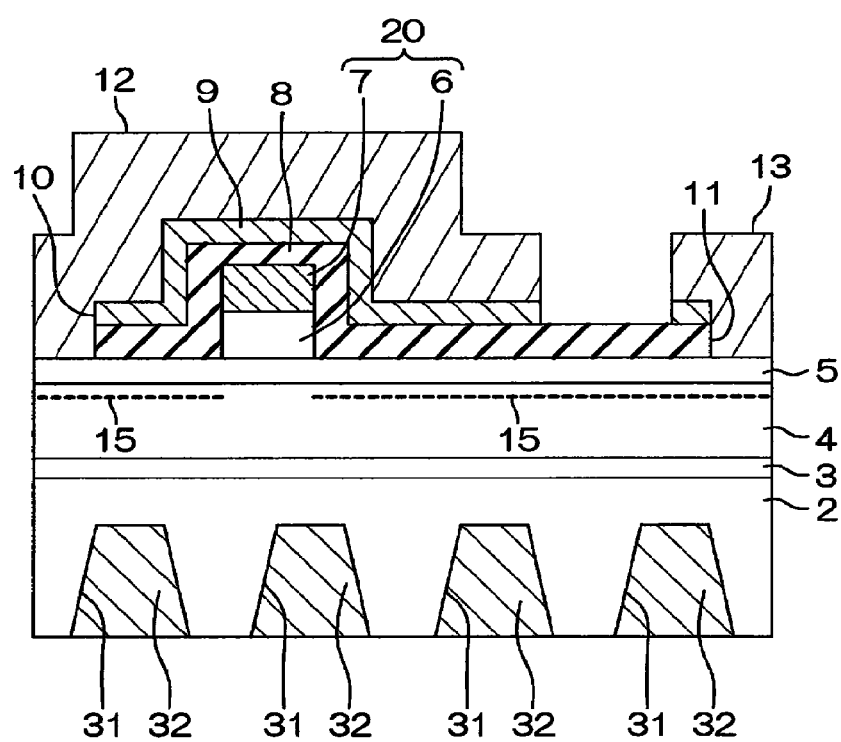
FIG. 4I is a cross-sectional view illustrating a next step of FIG. 4H.

Next, as illustrated in FIG. 4I, thermal conductors 32 are embedded in the plurality of recesses 31 by, for example, a plating method. Thereafter, a thermal conductive film 33 covering the thermal conductors 32 is formed on the rear surface 2b of the substrate 2 so as to make contact with the thermal conductors 32 in the plurality of recesses 31 to obtain the semiconductor device 1 having the structure as illustrated in FIG. 1.

In the first embodiment described above, the plurality of recesses 31 recessed from the rear surface 2b toward the surface 2a side are formed on the substrate 2. Further, the thermal conductor 32 made of a material having a thermal conductivity higher than that of the Si substrate 2 is embedded in each recess 31. Thus, since heat generated in the device can be transferred to the rear side of the Si substrate 2 via the thermal conductor 32 made of a material having a thermal conductivity higher than that of the Si substrate 2, it is possible to efficiently dissipate the heat generated in the device from the rear surface 2b of the Si substrate 2.

Further, in the first embodiment described above, the thermal conductive film 33 made of a material having a thermal conductivity higher than that of the Si substrate 2 is formed on the rear surface 2b of the substrate 2 so as to make contact with the thermal conductors 32. Thus, since heat generated in the device can be efficiently transferred to the thermal conductive film 33 formed on the rear side of the Si substrate 2, it is possible to more efficiently dissipate the heat generated in the device from the rear surface 2b of the Si substrate 2.

Figure 5:
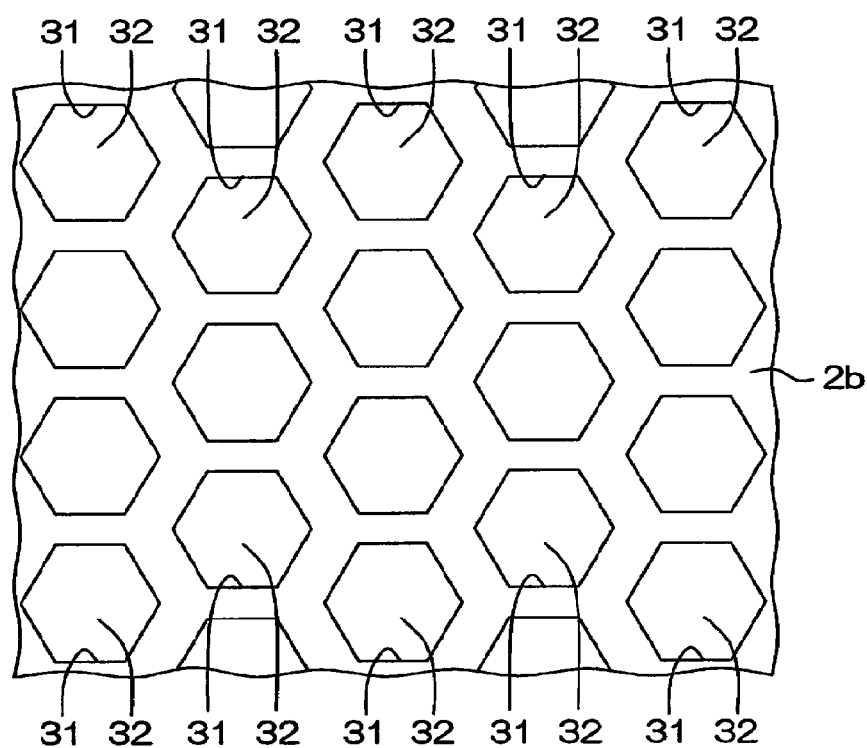
FIG. 5 is a schematic bottom view illustrating another example of the shape of recesses, in which the thermal conductive film formed on the rear surface of the substrate is omitted.
Figure 6:
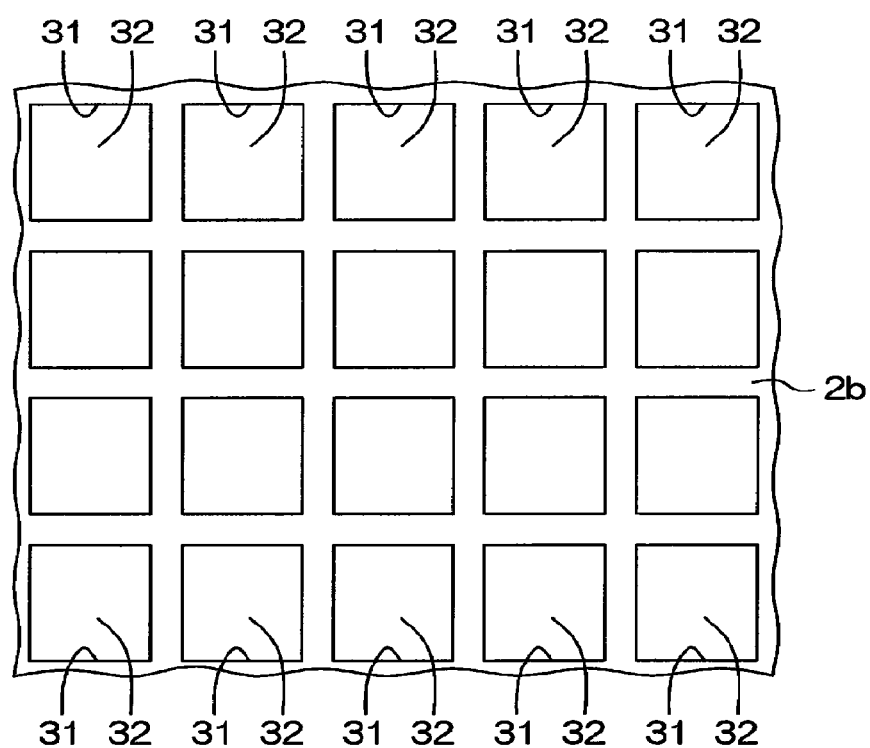
FIG. 6 is a schematic bottom view illustrating another example of the shape of recesses, in which the thermal conductive film formed on the rear surface of the substrate is omitted.

In the first embodiment described above, the recess 31 (thermal conductor 32) has a truncated cone shape whose cross section is gradually reduced from the rear surface 2b toward the surface 2a of the substrate 2, but the recess 31 (thermal conductor 32) may have a truncated pyramid shape whose cross section is gradually reduced from the rear surface 2b toward the surface 2a of the substrate 2. In other words, the cross section of the recess 31 (thermal conductor 32) may be polygonal. FIG. 5 illustrates an example in which a plurality of recesses 31 (thermal conductors 32) having a hexagonal truncated pyramid shape on its bottom surface are arranged in a staggered arrangement. FIG. 6 illustrates an example in which a plurality of recesses 31 (thermal conductors 32) having a rectangular truncated pyramid shape on its bottom surface are arranged in a matrix form. FIGS. 5 and 6 are schematic bottom views in which the thermal conductive film 33 formed on the rear surface of the substrate 2 is omitted. The recess 31 may have a prismatic shape.

Figure 7:
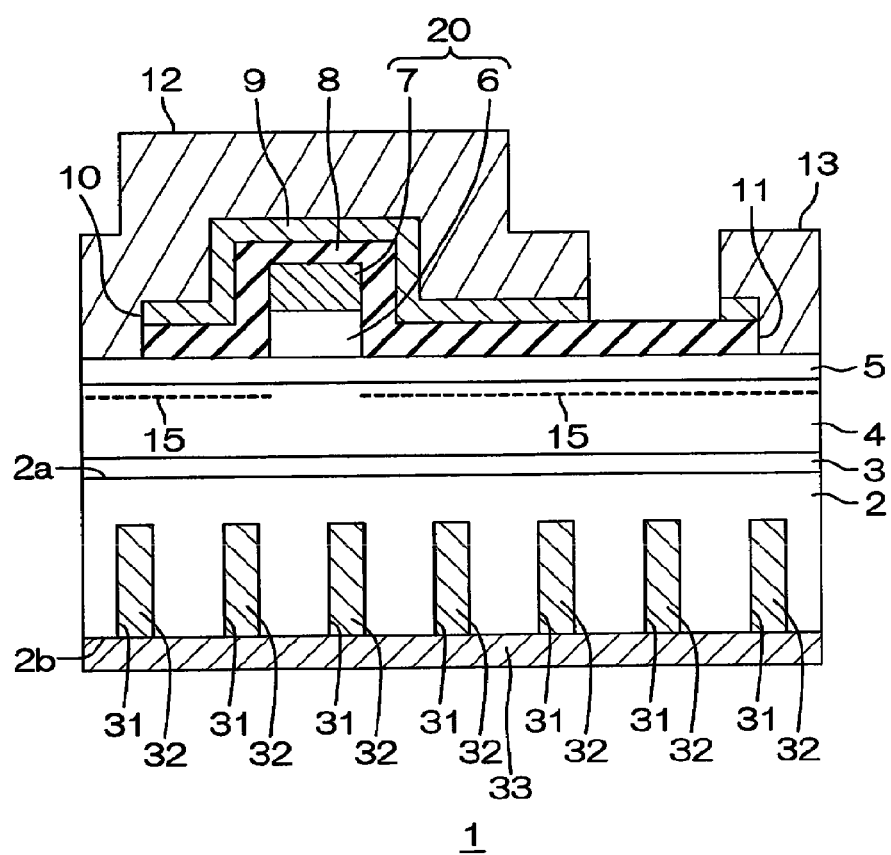
FIG. 7 is a schematic cross-sectional view illustrating another example of the shape of recesses.
Figure 8:
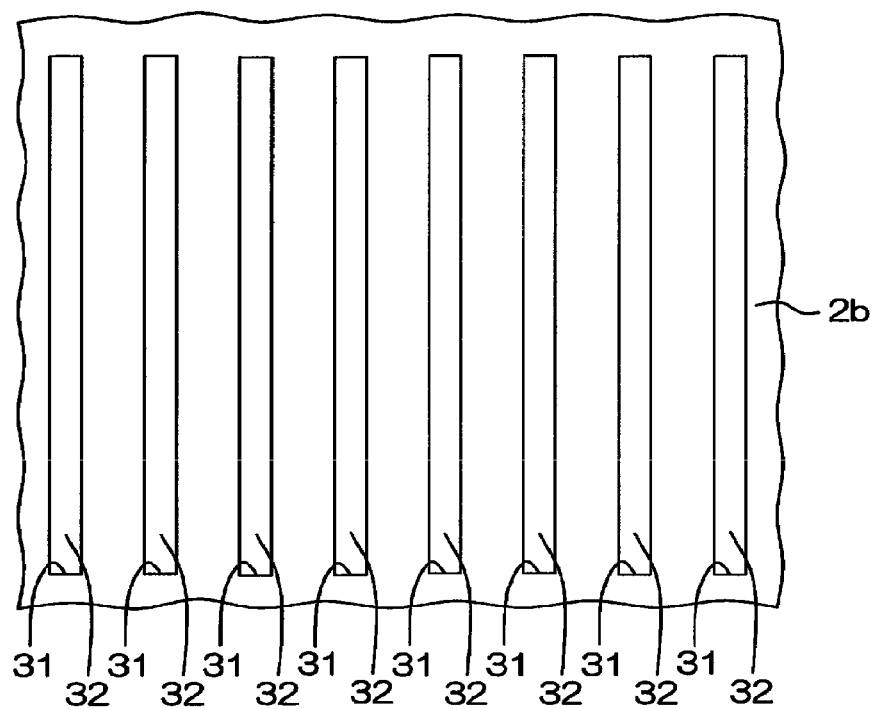
FIG. 8 is a schematic bottom view illustrating the recesses in FIG. 7, in which the thermal conductive film formed on the rear surface of the substrate is omitted.

Further, as illustrated in FIGS. 7 and 8, the plurality of recesses 31 (thermal conductors 32) may be configured as a plurality of elongated rectangular recesses 31 (thermal conductors 32) extending parallel to each other in a predetermined direction along the rear surface 2b of the substrate 2 in the bottom view. FIG. 7 is a schematic cross-sectional view of the nitride semiconductor device 1. FIG. 8 is a schematic bottom view in which the thermal conductive film 33 formed on the rear surface of the substrate 2 is omitted.

Figure 9:
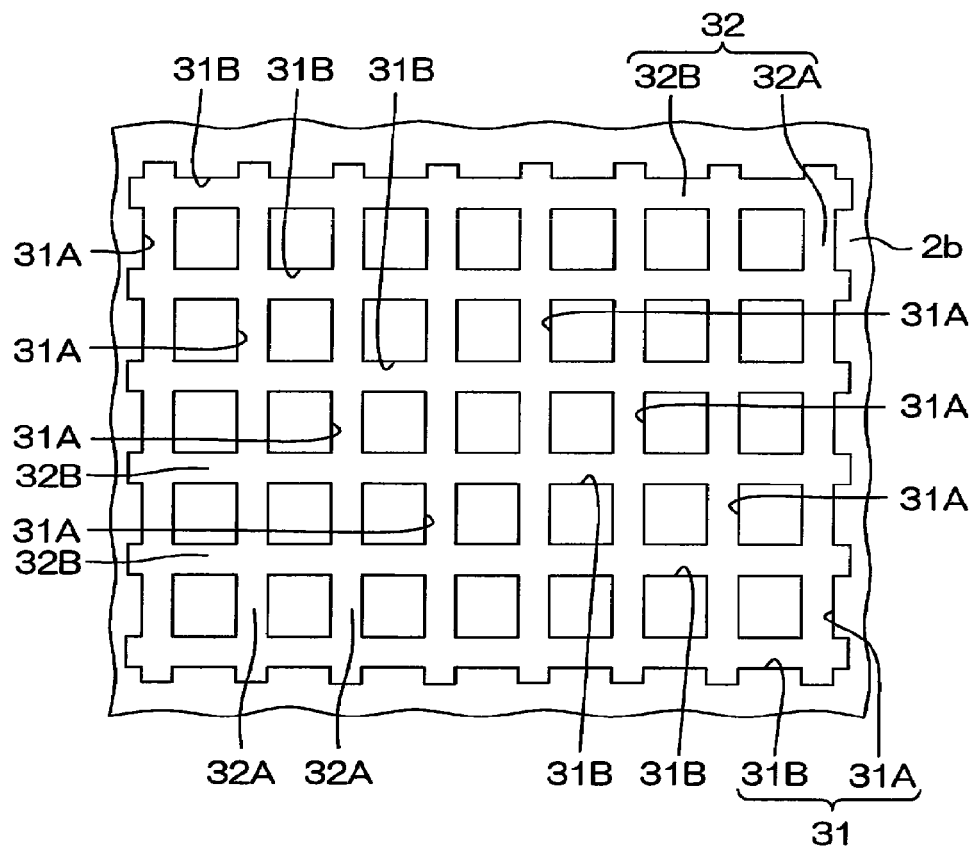
FIG. 9 is a schematic bottom view illustrating another example of the shape of recesses, in which the thermal conductive film formed on the rear surface of the substrate is omitted.

In addition, as illustrated in FIG. 9, the plurality of recesses 31 (thermal conductors 32) may be configured by a plurality of elongated rectangular first recesses 31A (first thermal conductors 32A) extending parallel to each other in a predetermined first direction along the rear surface 2b of the substrate 2, and a plurality of elongated rectangular second recesses 31B (second thermal conductors 32B) extending parallel to each other in a direction along the rear surface 2b of the substrate 2 and in a second direction orthogonal to the first direction, in the bottom view. The plurality of first recesses 31A (first thermal conductors 32A) intersects the plurality of second recesses 23B (second thermal conductors 32B). FIG. 9 is a bottom view in which the thermal conductive film 33 formed on the rear surface of the substrate 2 is omitted.

Figure 10:
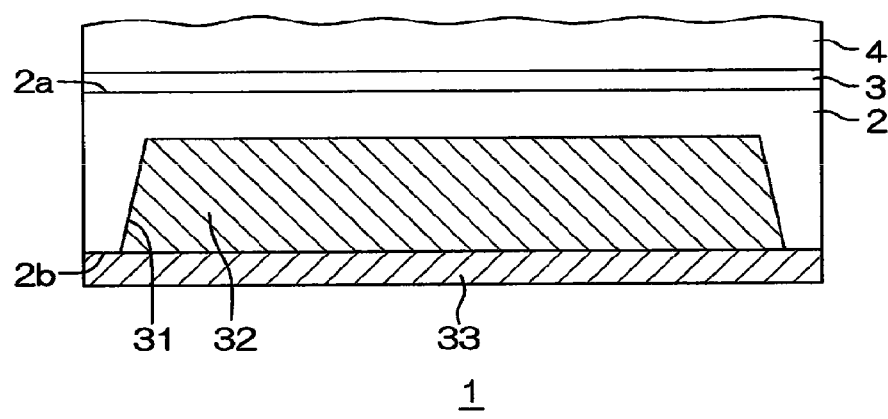
FIG. 10 is a schematic cross-sectional view illustrating another example of the shape of recesses.
Figure 11:
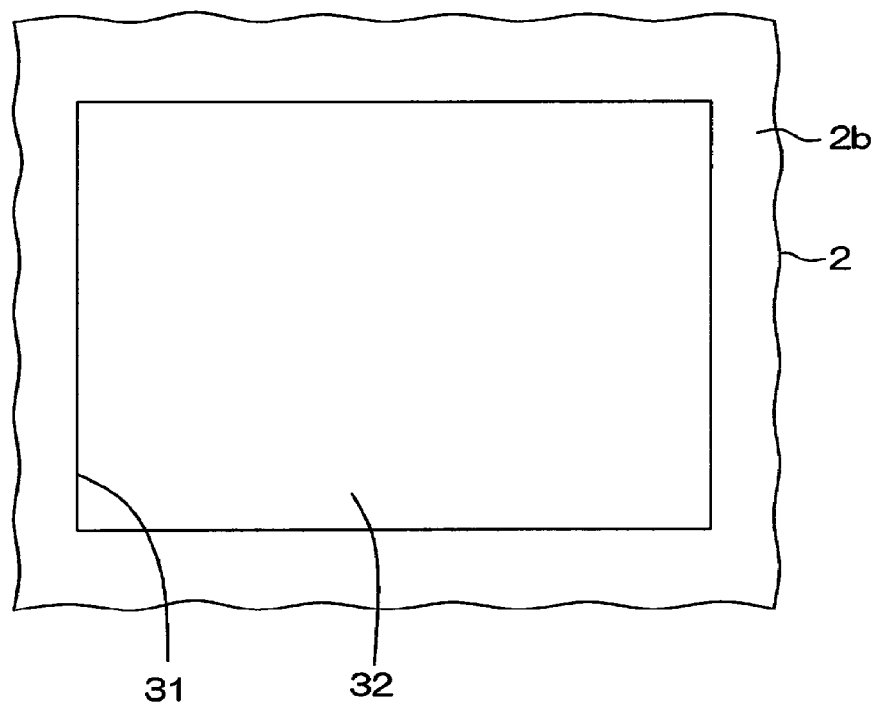
FIG. 11 is a schematic bottom view illustrating the recesses in FIG. 10, in which the thermal conductive film formed on the rear surface of the substrate is omitted.

Further, as illustrated in FIGS. 10 and 11, only one recess 31 (thermal conductor 32) may be formed in the central portion surrounded by the peripheral portion of the entire rear surface 2b of the substrate 2. In this example, the recess 31 (thermal conductor 32) has a rectangular truncated pyramid shape. FIG. 10 is a schematic cross-sectional view of the entire nitride semiconductor device 1, in which a portion above the first nitride semiconductor layer 4 is omitted. FIG. 11 is a schematic bottom view illustrating the entire rear surface 2b of the substrate 2, in which the thermal conductive film 33 formed on the rear surface 2b of the substrate 2 is omitted.

Figure 12:
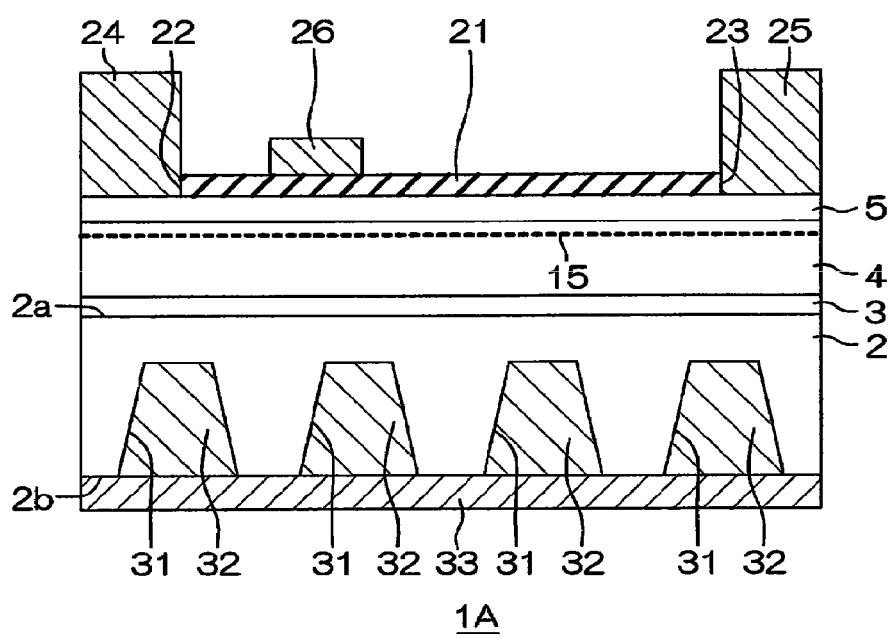
FIG. 12 is a schematic cross-sectional view illustrating a configuration of a nitride semiconductor device according to a second embodiment of the present disclosure.

FIG. 12 is a schematic cross-sectional view illustrating a configuration of a nitride semiconductor device according to a second embodiment of the present disclosure. In FIG. 12, parts corresponding to the respective parts in FIG. 1 described above are given the same reference numerals as those in FIG. 1.

A nitride semiconductor device 1A includes a semiconductor laminated structure (nitride semiconductor structure) including a substrate 2, a buffer layer 3 formed on a surface 2a of the substrate 2, a first nitride semiconductor layer 4 epitaxially grown on the buffer layer 3, and a second nitride semiconductor layer 5 epitaxially grown on the first nitride semiconductor layer 4.

In addition, the nitride semiconductor device 1A further includes a gate insulating film 21 formed on the second nitride semiconductor layer 5. Further, the nitride semiconductor device 1A includes a source electrode 24 and a drain electrode 25 making ohmic contact with the second nitride semiconductor layer 5 through a source electrode contact hole 22 and a drain electrode contact hole 23 formed on the gate insulating film 21. The source electrode 24 and the drain electrode 25 are arranged at an interval.

Further, the nitride semiconductor device 1A includes a gate electrode 26 formed on the gate insulating film 21. The gate electrode 26 is arranged between the source electrode 24 and the drain electrode 25. The nitride semiconductor device 1A is actually formed to be longer than the one illustrated in FIG. 12 in the lateral direction of the page of FIG. 12, and the source electrode (S) 24, the gate electrode (G) 26, and the drain electrode (D) 25 are periodically arranged in the order of SGDGSGD in the lateral direction of the page of FIG. 12.

In the present embodiment, the substrate 2 is a low-resistance silicon substrate. The low-resistance silicon substrate may have an impurity concentration of, for example, $1 \times 10^{17}$ cm$^{-3}$ to $1 \times 10^{20}$ cm$^{-3}$ (more specifically, about $1 \times 10^{18}$ cm$^{-3}$).

The buffer layer 3 is a buffer layer for alleviating distortion caused by a difference between a lattice constant of the first nitride semiconductor layer 4 formed on the buffer layer 3 and a lattice constant of the substrate 2. In the present embodiment, the buffer layer 3 is configured with a multi-layer buffer layer in which a plurality of nitride semiconductor films are laminated. In the present embodiment, the buffer layer 3 is configured with a laminated film of an AlN film making contact with the surface 2a of the substrate 2 and an AlGaN film laminated on a surface (a surface on the opposite side of the substrate 2) of the AlN film. The buffer layer 3 may be configured with a single film of the AlN film or a single film of the AlGaN film.

The first nitride semiconductor layer 4 constitutes an electron transit layer. In the present embodiment, the first nitride semiconductor layer 4 is made of an n-type GaN layer doped with a donor type impurity. Further, the first nitride semiconductor layer 4 may be made of an undoped GaN layer.

The second nitride semiconductor layer 5 constitutes an electron supply layer. The second nitride semiconductor layer 5 is made of a nitride semiconductor having a band gap larger than that of the first nitride semiconductor layer 4. Specifically, the second nitride semiconductor layer 5 is made of a nitride semiconductor having an Al composition higher than that of the first nitride semiconductor layer 4. In the nitride semiconductors, the higher the Al composition is, the larger the band gap is. In the present embodiment, the second nitride semiconductor layer 5 is configured as an $Al_{x1}Ga_{1-x1}N$ layer (where 0<x1<1).

In this manner, the first nitride semiconductor layer 4 (electron transit layer) and the second nitride semiconductor layer 5 (electron supply layer) are made of nitride semiconductors having different band gaps (Al compositions), and a lattice mismatch occurs between them. Further, due to spontaneous polarization of the first nitride semiconductor layer 4 and the second nitride semiconductor layer 5 and piezo polarization caused by the lattice mismatch therebetween, the energy level of the conduction band of the first nitride semiconductor layer 4 becomes lower than the Fermi level at the interface between the first nitride semiconductor layer 4 and the second nitride semiconductor layer 5. Thus, a 2D electron gas (2 DEG) 15 spreads at a position (for example, at a distance of several Å from the interface) close to the interface between the first nitride semiconductor layer 4 and the second nitride semiconductor layer 5.

The gate insulating film 21 is formed on substantially the entire surface of the surface of the second nitride semiconductor layer 5. In the present embodiment, the gate insulating film 21 is made of SiO$_2$. In addition to being made of SiO$_2$, the gate insulating film 21 may be made of SiN, SiON, Al$_2$O$_3$, AlN, AlON, HfO, HfN, HfON, HfSiON, AlON, or the like.

The source electrode 24 and the drain electrode 25 are made of, for example, a TiN/AlSiCu/Ti/TiN laminated film in which a Ti film, an AlSiCu film, a Ti film, and a TiN film are sequentially laminated from below.

The gate electrode 26 is formed so as to make contact with the surface of the gate insulating film 21. The gate electrode 26 is arranged so as to be biased toward the source electrode contact hole 22. The gate electrode 26 is made of, for example, a TiN/AlSiCu/Ti/TiN laminated film in which a Ti film, an AlSiCu film, a Ti film, and a TiN film are sequentially laminated from below.

A plurality of recesses 31 recessed from the rear surface 2b toward the surface 2a side are formed on the substrate 2. A thermal conductor 32 made of a material having a thermal conductivity higher than that of the Si substrate 2 is embedded in each recess 31. In the present embodiment, the thermal conductor 32 is formed so as to fill the space in the recess 31. The thermal conductor 32 is made of, for example, copper (Cu). In addition to being made of Cu, the thermal conductor 32 is made of one arbitrarily selected from Ti, Ni, Cu, Ag, Au, Pb, Sn, Sb, Bi, In, and Al, or any combination thereof.

In the present embodiment, the recess 31 (thermal conductor 32) has a truncated cone shape whose cross section is gradually reduced from the rear surface 2b toward the surface 2a of the substrate 2. As illustrated in FIG. 2, the plurality of recesses 31 (thermal conductors 32) are arranged in a staggered arrangement in the bottom view as viewed from the normal direction with respect to the rear surface 2b of the substrate 2. As illustrated in FIG. 3, the plurality of recesses 31 (thermal conductors 32) may be arranged in a matrix form. In FIGS. 2 and 3, for convenience of description, a thermal conductive film 33 (see FIG. 12) on the rear surface 2b side of the substrate 2 as described below is omitted. The recess 31 may be columnar.

The thermal conductive film 33 is formed so as to make contact with the thermal conductors 32 on the rear surface 2b of the substrate 2. The thermal conductive film 33 is made of a material having a thermal conductivity higher than that of the Si substrate 2. The thermal conductive film 33 is configured with, for example, a laminated film of Ti, Ni, and Ag. In addition to being configured with the laminated film of Ti, Ni, and Ag, the thermal conductive film 33 may be made of one arbitrarily selected from Ti, Ni, Cu, Ag, Au, Pb, Sn, Sb, Bi, In, and Al, or any combination thereof.

In this nitride semiconductor device 1A, the second nitride semiconductor layer 5 (electron supply layer) having a different band gap (Al composition) is formed on the first nitride semiconductor layer 4 (electron transit layer) to form a heterojunction. Thus, the 2D electron gas 15 is formed in the first nitride semiconductor layer 4 near the interface between the first nitride semiconductor layer 4 and the second nitride semiconductor layer 5 to form an HEMT using the 2D electron gas 15 as a channel. In a state where no control voltage is applied to the gate electrode 26, the source electrode 24 and the drain electrode 25 are connected to each other with the 2D electron gas 15 as a channel. Therefore, this HEMT is of a normally-ON type. When a control voltage at which the potential of the gate electrode 26 becomes negative with respect to the source electrode 24 is applied to the gate electrode 26, the 2D electron gas 15 is cut off and the HEMT is turned off.

In the second embodiment described above, the plurality of recesses 31 recessed from the rear surface 2b toward the surface 2a are formed on the substrate 2. Further, the thermal conductor 32 made of a material having a thermal conductivity higher than that of the Si substrate 2 is embedded in each recess 31. Therefore, since heat generated in the device can be transferred to the rear side of the Si substrate 2 via the thermal conductor 32 made of a material having a thermal conductivity higher than that of the Si substrate 2, it is possible to efficiently dissipate heat generated in the device from the rear surface 2b of the Si substrate 2.

Further, in the second embodiment described above, the thermal conductive film 33 made of a material having a thermal conductivity higher than that of the Si substrate 2 is formed on the rear surface 2b of the substrate 2 so as to make contact with the thermal conductors 32. Therefore, since heat generated in the device can be efficiently transferred to the thermal conductive film 33 formed on the rear side of the Si substrate 2, it is possible to more efficiently dissipate the heat generated in the device from the rear surface 2b of the Si substrate 2.

Also in the second embodiment, various modifications of the recesses 31 (thermal conductors 31) described above with reference to FIGS. 5 to 11 may be used as the recesses 31 (thermal conductors 31).

Figure 13:
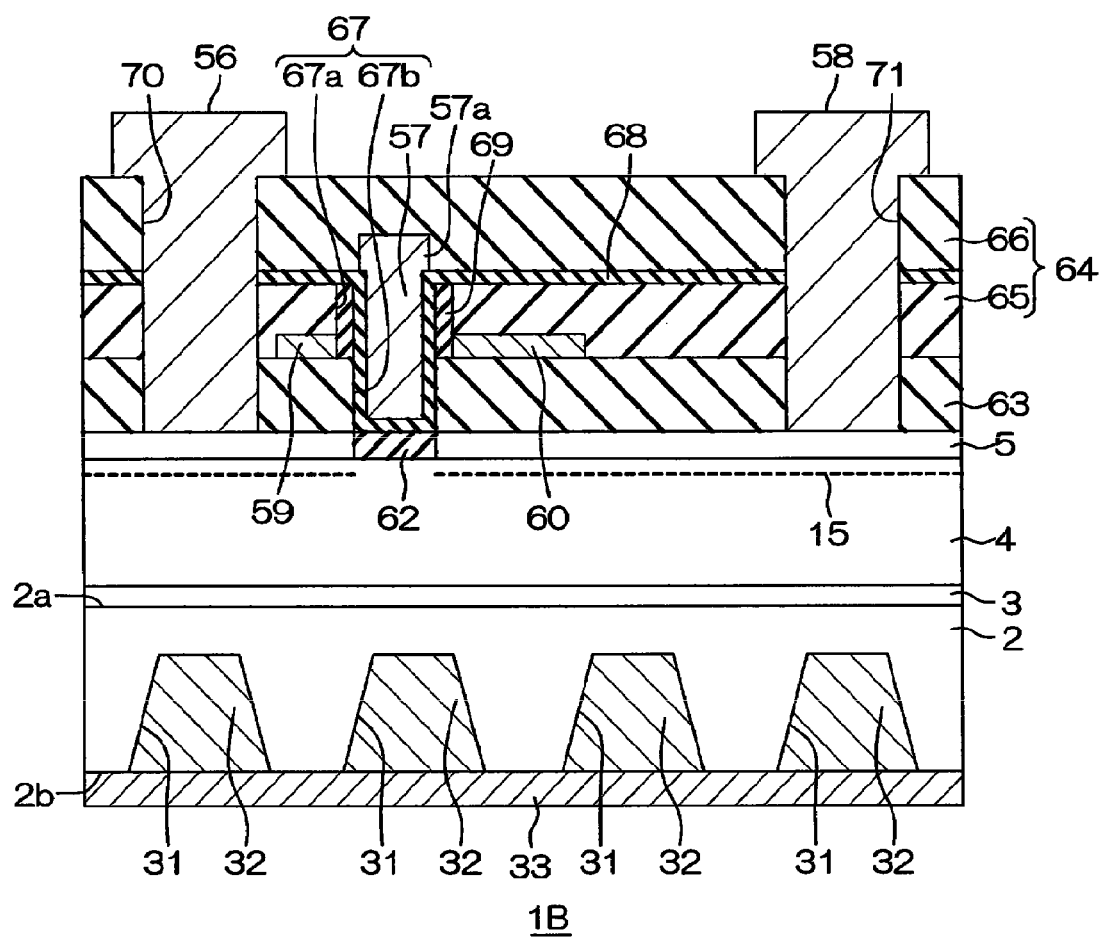
FIG. 13 is a schematic cross-sectional view illustrating a configuration of a nitride semiconductor device according to a third embodiment of the present disclosure.

FIG. 13 is a cross-sectional view illustrating a configuration of a nitride semiconductor device according to a third embodiment of the present disclosure. In FIG. 13, parts corresponding to the respective parts in FIG. 1 described above are given the same reference numerals as those in FIG. 1.

A nitride semiconductor device 1B has a semiconductor laminated structure (nitride semiconductor structure) including a substrate 2, a buffer layer 3 formed on a surface 2a of the substrate 2, a first nitride semiconductor layer 4 epitaxially grown on the buffer layer 3, and a second nitride semiconductor layer 5 epitaxially grown on the first nitride semiconductor layer 4.

In addition, the nitride semiconductor device 1B further includes a source electrode 56, a gate electrode 57, a drain electrode 58, a floating plate 59, and a source field plate 60, which are arranged on the second nitride semiconductor layer 5. The floating plate 59 is arranged between the source electrode 56 and the gate electrode 57. The source field plate 60 is arranged between the gate electrode 57 and the drain electrode 58.

The nitride semiconductor device 1B is actually formed to be longer than the one illustrated in FIG. 13 in the lateral direction of the page of FIG. 13, and the source electrode (S) 56, the gate electrode (G) 57, and the drain electrode (D) 58 are periodically arranged in the order of SGDGSGD in the lateral direction of the page of FIG. 13.

The substrate 2 may be, for example, a silicon substrate. The buffer layer 3 is configured with a laminated film of an AlN film making contact with the surface 2a of the substrate 2 and an AlGaN film laminated on a surface (a surface on the opposite side of the substrate 2) of the AlN film. The buffer layer 3 may be configured with a single film of the AlN film or a single film of the AlGaN film.

The first nitride semiconductor layer 4 constitutes an electron transit layer. The second nitride semiconductor layer 5 constitutes an electron supply layer. The first nitride semiconductor layer 4 and the second nitride semiconductor layer 5 are formed of nitride semiconductors having different Al compositions. In the present embodiment, the first nitride semiconductor layer 4 is made of a GaN layer. The second nitride semiconductor layer 5 is formed of a nitride semiconductor having an Al composition higher than that of the first nitride semiconductor layer 4. In the present embodiment, the second nitride semiconductor layer 5 is made of an AlN layer.

In this manner, the first nitride semiconductor layer 4 (electron transit layer) and the second nitride semiconductor layer 5 (electron supply layer) are formed of nitride semiconductors having different Al compositions, and a lattice mismatch occurs between them. Further, due to spontaneous polarization of the first nitride semiconductor layer 4 and the second nitride semiconductor layer 5 and piezo polarization caused by the lattice mismatch therebetween, the energy level of the conduction band of the first nitride semiconductor layer 4 becomes lower than the Fermi level at the interface between the first nitride semiconductor layer 4 and the second nitride semiconductor layer 5. Thus, a 2D electron gas (2 DEG) 15 spreads at a position (for example, at a distance of several A from the interface) close to the interface between the first nitride semiconductor layer 4 and the second nitride semiconductor layer 5.

An oxide film 62 is selectively formed in the second nitride semiconductor layer 5 so as to extend from its surface to the first nitride semiconductor layer 4. The oxide film 62 has a thickness substantially equal to that of the second nitride semiconductor layer 5. The oxide film 62 is, for example, a thermal oxide film. In the case where the second nitride semiconductor layer 5 is an AlN layer, the oxide film 62 may be made of an AlON film.

The nitride semiconductor device 1B further includes a passivation film 63 and an insulating layer 64 formed on the second nitride semiconductor layer 5. The passivation film 63 is made of a SiN film. In the present embodiment, the passivation film 63 has a function of weakening the polarization of the second nitride semiconductor layer 5, in addition to a function as an oxidation protective film of the second nitride semiconductor layer 5.

The insulating layer 64 is configured to cover the passivation film 63, and includes a first layer 65 and a second layer 66 formed on the first layer 65. For example, both the first layer 65 and the second layer 66 may be configured as a $SiO_2$ film.

A gate opening 67 reaching the second nitride semiconductor layer 5 (oxide film 62) is formed in the first layer 65 and the passivation film 63. The gate opening 67 includes a first opening 67a formed in the first layer 65, and a second opening 67b, which is formed in the passivation film 63 and communicates with the first opening 67a. The oxide film 62 is exposed at the bottom of the gate opening 67. A gate insulating film 68 is formed so as to cover the bottom and sides of the gate opening 67. The gate insulating film 68 is formed between the first layer 65 and the second layer 66 in addition to the inside of the gate opening 67. For example, the gate insulating film 68 may be made of at least one type of material film, selected from a group consisting of Si, Al, and Hf as constituent elements. Specifically, the gate insulating film 68 may be made of at least one type of material film, selected from a group consisting of SiN, $SiO_2$, SiON, $Al_2O_3$, AlN, AlON, HfSiO, $HfO_2$, and the like. Among them, the $Al_2O_3$ film may be used in some embodiments.

The gate electrode 57 is embedded in the gate opening 67. In the present embodiment, the gate electrode 57 includes an overlapping portion 57a formed on the gate insulating film 68 at the periphery of the gate opening 67. For example, the gate electrode 57 may be configured with a metal electrode, such as Mo, Ni, or the like, or may be configured with a semiconductor electrode, such as doped polysilicon or the like.

The floating plate 59 and the source field plate 60 are arranged on the side of the gate electrode 57 so as to partially form the side portion of the gate opening 67. Specifically, the floating plate 59 and the source field plate 60 are formed on the passivation film 63 so as to be exposed on a lower side of a side portion of the gate opening 67. That is, the side portion of the gate opening 67 is formed by the floating plate 59 and the source field plate 60 on the lower side and by the insulating layer 64 (first layer 65) on the upper side, so as to have a laminated layer interface of the conductive layer and the insulating layer. The source field plate 60 is electrically connected to the source electrode 56. As is well known, the source field plate 60 is installed to relax electric field concentration to the end of the gate electrode 57.

An insulating sidewall 69 is formed on the sides of the first opening 67a so as to make contact with the floating plate 59 and the source field plate 60. That is, the sidewall 69 is arranged between the sides of the first opening 67a and the gate insulating film 68. For example, the sidewall 69 may be made of at least one type of material film, selected from a group consisting of $SiO_2$, SiN, and SiON. Among them, the $SiO_2$ film may be used in some embodiments.

The floating plate 59 and the source field plate 60 are insulated from the gate electrode 57 by the sidewall 69 and the gate insulating film 68. The floating plate 59 and the source field plate 60 may be made of a Mo film.

A source electrode contact hole 70 and a drain electrode contact hole 71 reaching the second nitride semiconductor layer 5 are formed in the insulating layer 64 and the passivation film 63. The source electrode contact hole 70 and the drain electrode contact hole 71 are formed at positions spaced laterally away from the gate opening 67. The source electrode 56 and the drain electrode 58 are embedded in the source electrode contact hole 70 and the drain electrode contact hole 71, respectively. The source electrode 56 and the drain electrode 58 are electrically connected to the second nitride semiconductor layer 5 in the source electrode contact hole 70 and the drain electrode contact hole 71, respectively.

A plurality of recesses 31 recessed from the rear surface 2b toward the surface 2a are formed on the substrate 2. A thermal conductor 32 made of a material having a thermal conductivity higher than that of the Si substrate 2 is embedded in each recess 31. In the present embodiment, the thermal conductor 32 is formed so as to fill the space in the recess 31. The thermal conductor 32 is made of, for example, copper (Cu). In addition to Cu, the thermal conductor 32 is made of one arbitrarily selected from Ti, Ni, Cu, Ag, Au, Pb, Sn, Sb, Bi, In, and Al, or any combination thereof.

In the present embodiment, the recess 31 (thermal conductor 32) has a truncated cone shape whose cross section is gradually reduced from the rear surface 2b of the substrate 2 toward the surface 2a. As illustrated in FIG. 2, the plurality of recesses 31 (thermal conductors 32) are arranged in a staggered arrangement in the bottom view as viewed from the normal direction with respect to the rear surface 2b of the substrate 2. As illustrated in FIG. 3, the plurality of recesses 31 (thermal conductors 32) may be arranged in a matrix form. In FIGS. 2 and 3, for convenience of description, a thermal conductive film 33 (see FIG. 13) on the rear surface 2b side of the substrate 2 as described below is omitted. The recess 31 may be columnar.

The thermal conductive film 33 is formed on the rear surface 2b of the substrate 2 so as to make contact with the thermal conductors 32. The thermal conductive film 33 is made of a material having a thermal conductivity higher than that of the Si substrate 2. The thermal conductive film 33 is configured with, for example, a laminated film of Ti, Ni, and Ag. In addition to the laminated film of Ti, Ni, and Ag, the thermal conductive film 33 may be made of one arbitrarily selected from Ti, Ni, Cu, Ag, Au, Pb, Sn, Sb, Bi, In, and Al, or any combination thereof.

In this nitride semiconductor device 1B, the second nitride semiconductor layer 5 having a different Al composition is formed on the first nitride semiconductor layer 4 to form a heterojunction. Thus, the 2D electron gas 15 is formed in the first nitride semiconductor layer 4 near the interface between the first nitride semiconductor layer 4 and the second nitride semiconductor layer 5 to form an HEMT using the 2D electron gas 15 as a channel.

The gate electrode 57 faces the first nitride semiconductor layer 4 with the laminated film of the oxide film 62 and the gate insulating film 68 interposed therebetween, and the second nitride semiconductor layer 5 does not exist right under the gate electrode 57. Therefore, the 2D electron gas 15 resulting from polarization due to the lattice mismatch between the first nitride semiconductor layer 4 and the second nitride semiconductor layer 5 is not formed right under the gate electrode 57. Thus, when no bias is applied to the gate electrode 57 (at zero bias), the channel by the 2D electron gas 15 is blocked right under the gate electrode 57. Accordingly, a normally-OFF type HEMT is realized. When an appropriate ON voltage (e.g., 5 V) is applied to the gate electrode 57, a channel is induced in the first nitride semiconductor layer 4 right under the gate electrode 57, such that the 2D electron gas 15 on both sides of the gate electrode 57 is connected through the channel. Thus, electricity is conducted between the source and the drain.

When in use, for example, a predetermined voltage (e.g., 200 to 400 V) at which the drain electrode 58 side becomes positive is applied between the source electrode 56 and the drain electrode 58. In this state, an OFF voltage (0 V) or an ON voltage (5 V) is applied to the gate electrode 57 with the source electrode 56 at a reference potential (0 V).

In the third embodiment described above, the plurality of recesses 31 recessed from the rear surface 2b toward the surface 2a side are formed on the substrate 2. The thermal conductor 32 made of a material having a thermal conductivity higher than that of the Si substrate 2 is embedded in each recess 31. Therefore, since heat generated in the device can be transferred to the rear side of the Si substrate 2 via the thermal conductor 32 made of a material having a thermal conductivity higher than that of the Si substrate 2, it is possible to efficiently dissipate the heat generated in the device from the rear surface 2b of the Si substrate 2.

Further, in the third embodiment described above, the thermal conductive film 33 made of a material having a thermal conductivity higher than that of the Si substrate 2 is formed on the rear surface 2b of the substrate 2 so as to make contact with the thermal conductors 32. Therefore, since heat generated in the device can be efficiently transferred to the thermal conductive film 33 formed on the rear side of the Si substrate 2, it is possible to more efficiently dissipate the heat generated in the device from the rear surface 2b of the Si substrate 2.

Also in the third embodiment, various modifications of the recess 31 (thermal conductor 31) described above with reference to FIGS. 5 to 11 may be used as the recess 31 (thermal conductor 31).

Although the first and second embodiments of the present disclosure have been described above, the present disclosure may be implemented in another embodiment. For example, in the first and second embodiments described above, there has been described an example in which the first nitride semiconductor layer (electron transit layer) 4 is configured as a GaN layer and the second nitride semiconductor layer (electron supply layer) 5 is configured with an AlGaN layer. However, it is sufficient that the first nitride semiconductor layer 4 and the second nitride semiconductor layer 5 have different band gaps (for example, Al compositions), and other combinations are also possible. For example, GaN/AlN, AlGaN/AlN and the like may be exemplified as a combination of the first nitride semiconductor layer 4 and the second nitride semiconductor layer 5.

In addition, various design changes may be made within the scope of the matters described in claims.

According to the present disclosure in some embodiments, it is possible to provide a nitride semiconductor device having a Si substrate that is capable of efficiently dissipating heat generated in the device from a rear surface of a Si substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride semiconductor device, comprising:
   a Si substrate having a top surface and a rear surface;
   a first nitride semiconductor layer arranged on the top surface of the Si substrate and constituting an electron transit layer;
   a second nitride semiconductor layer formed on the first nitride semiconductor layer and constituting an electron supply layer;
   a gate electrode arranged on the second nitride semiconductor layer;
   a source electrode and a drain electrode arranged on the second nitride semiconductor layer so as to be separated from the gate electrode with the gate electrode interposed therebetween, and electrically connected to the second nitride semiconductor layer;
   at least one recess formed on the Si substrate and recessed from the rear surface toward the top surface of the Si substrate; and
   a thermal conductor embedded in the at least one recess and made of a material having a thermal conductivity higher than a thermal conductivity of the Si substrate, wherein the at least one recess includes a plurality of recesses,
   wherein the plurality of recesses are arranged in a staggered arrangement in a bottom view as viewed from a normal direction with respect to the rear surface of the Si substrate.

2. The device of claim 1, further comprising a thermal conductive film formed on the rear surface of the Si substrate so as to make contact with the thermal conductor and made of a material having a thermal conductivity higher than a thermal conductivity of the Si substrate.

3. The device of claim 2, wherein the thermal conductive film is made of any one selected among Ti, Ni, Cu, Ag, Au, Pb, Sn, Sb, Bi, In, and Al, or any combination thereof.

4. The device of claim 1, wherein cross sections of the plurality of recesses are circular or polygonal.

5. The device of claim 1, further comprising a third nitride semiconductor layer arranged between the Si substrate and the first nitride semiconductor layer and constituting a buffer layer.

6. The device of claim 5, wherein the first nitride semiconductor layer is made of a GaN layer, the second nitride semiconductor layer is made of an AlGaN layer, and the buffer layer is made of a laminated film of an AlN layer formed on the top surface of the Si substrate and an AlGaN layer formed on the AlN layer.

7. The device of claim 1, wherein the first nitride semiconductor layer is made of a GaN layer and the second nitride semiconductor layer is made of an AlGaN layer.

8. A nitride semiconductor device, comprising:
a Si substrate having a top surface and a rear surface;
a first nitride semiconductor layer arranged on the top surface of the Si substrate and constituting an electron transit layer;
a second nitride semiconductor layer formed on the first nitride semiconductor layer and constituting an electron supply layer;
a gate electrode arranged on the second nitride semiconductor layer;
a source electrode and a drain electrode arranged on the second nitride semiconductor layer so as to be separated from the gate electrode with the gate electrode interposed therebetween, and electrically connected to the second nitride semiconductor layer;
at least one recess formed on the Si substrate and recessed from the rear surface toward the top surface of the Si substrate; and
a thermal conductor embedded in the at least one recess and made of a material having a thermal conductivity higher than a thermal conductivity of the Si substrate,
wherein the at least one recess includes a plurality of elongated rectangular first recesses extending parallel to each other in a predetermined first direction along the rear surface of the Si substrate, and a plurality of elongated rectangular second recesses extending parallel to each other in a second direction that is along the rear surface of the Si substrate and orthogonal to the predetermined first direction, in a bottom view as viewed from a normal direction with respect to the rear surface of the Si substrate, the plurality of elongated rectangular second recesses intersecting the plurality of elongated rectangular first recesses.

9. The device of claim 1, wherein the thermal conductor is made of Cu.

10. A nitride semiconductor device, comprising:
a Si substrate having a top surface and a rear surface;
a first nitride semiconductor layer arranged on the top surface of the Si substrate and constituting an electron transit layer;
a second nitride semiconductor layer formed on the first nitride semiconductor layer and constituting an electron supply layer;
a nitride semiconductor gate layer arranged on the second nitride semiconductor layer;
a gate electrode arranged on the nitride semiconductor gate layer;
a source electrode and a drain electrode arranged on the second nitride semiconductor layer so as to be separated from the gate electrode with the gate electrode interposed therebetween, and electrically connected to the second nitride semiconductor layer;
at least one recess formed on the Si substrate and recessed from the rear surface toward the top surface of the Si substrate; and
a thermal conductor embedded in the at least one recess and made of a material having a thermal conductivity higher than a thermal conductivity of the Si substrate,
wherein the at least one recess includes a plurality of elongated rectangular first recesses extending parallel to each other in a predetermined first direction along the rear surface of the Si substrate, and a plurality of elongated rectangular second recesses extending parallel to each other in a second direction that is along the rear surface of the Si substrate and orthogonal to the predetermined first direction, in a bottom view as viewed from a normal direction with respect to the rear surface of the Si substrate, the plurality of elongated rectangular second recesses intersecting the plurality of elongated rectangular first recesses.

11. The device of claim 10, further comprising a passivation film that covers the nitride semiconductor gate layer and the gate electrode.

12. The device of claim 11, further comprising a barrier metal film arranged between a top surface of the passivation film and the source electrode.

13. The device of claim 10, wherein the nitride semiconductor gate layer is made of a nitride semiconductor doped with an acceptor type impurity.

14. The device of claim 10, wherein the nitride semiconductor gate layer is made of a GaN layer.

15. The device of claim 10, wherein the nitride semiconductor gate layer has a thickness of 10 nm to 100 nm.

* * * * *